(12) United States Patent
Hoefler et al.

(10) Patent No.: US 7,206,214 B2
(45) Date of Patent: Apr. 17, 2007

(54) ONE TIME PROGRAMMABLE MEMORY AND METHOD OF OPERATION

(75) Inventors: Alexander B. Hoefler, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/197,814

(22) Filed: Aug. 5, 2005

(65) Prior Publication Data

US 2007/0030719 A1 Feb. 8, 2007

(51) Int. Cl.
*G11C 17/00* (2006.01)

(52) U.S. Cl. ............... 365/94; 365/185.03; 365/185.26

(58) Field of Classification Search ........... 365/185.03, 365/185.18, 185.24, 185.26, 185.33, 230.06, 365/94

See application file for complete search history.

(56) References Cited

U.S. PATENT DOCUMENTS

| | | | |
|---|---|---|---|
| 5,825,686 A * | 10/1998 | Schmitt-Landsiedel et al. | 365/185.03 |
| 6,515,344 B1 | 2/2003 | Wollesen | |
| 6,667,902 B2 | 12/2003 | Peng | |
| 6,671,040 B2 | 12/2003 | Fong et al. | |
| 6,747,896 B2 * | 6/2004 | Wong | 365/185.18 |
| 6,937,521 B2 * | 8/2005 | Avni et al. | 365/185.22 |
| 2004/0190335 A1 * | 9/2004 | Pascucci | 365/185.01 |
| 2006/0054952 A1 * | 3/2006 | Schoellkopf et al. | 257/296 |

OTHER PUBLICATIONS

U.S. Appl. No. 10/640,723, filed Aug. 14, 2003.
U.S. Appl. No. 10/891,649, filed Jul. 15, 2004.

* cited by examiner

*Primary Examiner*—Gene N. Auduong
(74) *Attorney, Agent, or Firm*—Robert L. King; James L. Clingan, Jr.

(57) ABSTRACT

A one time programmable (OTP) memory has two-bit cells for increasing density. Each cell has two select transistors and a programmable transistor in series between the two select transistors. The programmable transistor has two independent storage locations. One is between the gate and a first source/drain region and the second is between the gate and a second source/drain region. The storage locations are portions of the gate dielectric where the sources or drains overlap the gate and are independently programmed by selectively passing a programming current through them. The programming current is of sufficient magnitude and duration to permanently reduce the impedance by more than three orders of magnitude of the storage locations to be programmed. The programming current is limited in magnitude to avoid damage to other circuit elements and is preferably induced at least in part by applying a negative voltage to the gate of the programming transistor.

20 Claims, 2 Drawing Sheets

ONE TIME PROGRAMMABLE MEMORY AND METHOD OF OPERATION

FIELD OF THE INVENTION

This invention relates generally to semiconductors, and more specifically, to semiconductor devices having information storage capability.

BACKGROUND OF THE INVENTION

One form of semiconductor memory is the one time programmable (OTP) memory. One form of an OTP memory is an antifuse. An antifuse functions oppositely to a fuse by initially being nonconductive. When programmed, the antifuse becomes conductive. To program an antifuse a dielectric layer such as an oxide is subjected to a high electric field to generate a tunneling current through the dielectric. The tunneling current leads to phenomenon known as hard dielectric breakdown. After dielectric breakdown, a conductive path is formed through the dielectric and thereby makes the antifuse become conductive.

Others have implemented antifuses in arrays having rows and columns to function as a nonvolatile memory after being programmed. This type of memory functions as a read only memory (ROM) because the programming is irreversible. Typically capacitor structures are used as the dielectric material of the antifuse. A capacitor and a select transistor are required to implement a single bit of information storage. The select transistor is required to select its associated particular capacitor for either a program or a read operation. Isolation elements are required at the boundaries of each bit in order to isolate the bits from each other. Therefore the area per bit is inefficient. As electronic devices evolve, an OTP memory which is smaller in area per bit is desired.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
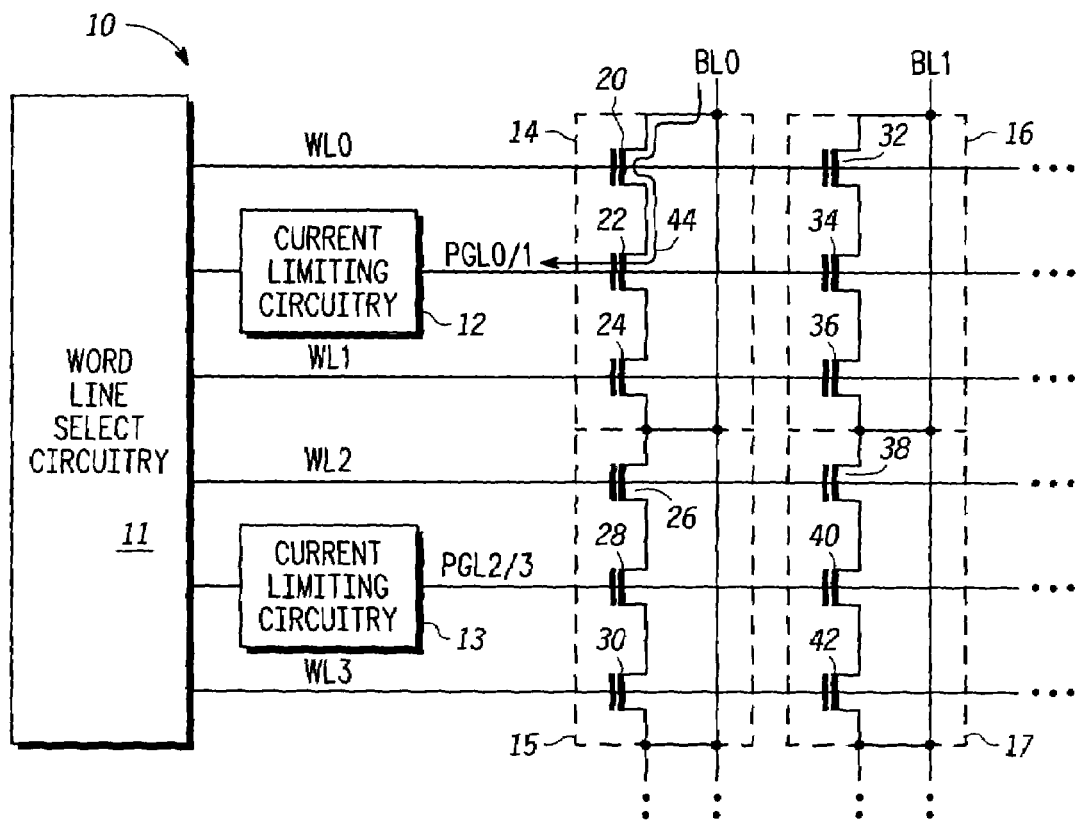
FIG. 1 illustrates in partial schematic form a one time programmable (OTP) memory array in accordance with the present invention.

Illustrated in FIG. 1 is a memory 10 arranged in an array of rows and columns of transistors. Memory 10 is an efficient OTP memory that is implemented having no capacitors and having three transistors to define two bits of programmed information. Memory 10 is illustrated having a memory cell 14, a memory cell 15, a memory cell 16 and a memory cell 17. Memory cell 14 has a first select transistor 20 of memory cell 14 having a drain connected to a first bit line labeled BL0. A gate of the first select transistor 20 is connected to a word line WL0 that is provided by a word line select circuitry 11. A source of the first select transistor 20 is connected to a drain of a program transistor 22. A source of program transistor 22 is connected to a source of a second select transistor 24 of memory cell 14. A gate of the program transistor 22 is connected to a program line signal labeled PGL 0/1 provided by a current limiting circuitry 12. The current limiting circuitry 12 is connected to the word line select circuitry 11. A drain of the second select transistor 24 is connected to a drain of a first select transistor 26 of memory cell 15 and to the first bit line labeled BL0. A gate of the second select transistor 24 is connected to a word line WL1 provided by the word line select circuitry 11. A gate of the first select transistor 26 is connected to a word line WL2 provided by the word line select circuitry 11. A source of the first select transistor 26 is connected to a drain of a program transistor 28. A gate of program transistor 28 is connected to a program signal PGL 2/3 provided by a current limiting circuitry 13. The current limiting circuitry 13 is connected to the word line select circuitry 11. A source of program transistor 28 is connected to a source of a second select transistor 30. A gate of second select transistor 30 is connected to a word line WL3 provided by the word line select circuitry 11. A drain of the second select transistor 30 is connected to the first bit line labeled BL0 and is connected to other memory cells (not shown) in the same column as indicated by the dashed line.

A transistor 32 of memory cell 16 has a drain that is connected to a second bit line BL1. A gate of transistor 32 is connected to the word line WL0). A source of transistor 32 is connected to a drain of a transistor 34. A gate of transistor 34 is connected to the program signal PGL 0/1. A source of transistor 34 is connected to a source of a transistor 36. A gate of transistor 36 is connected to the word line signal WL1. A drain of transistor 36 is connected to a drain of a transistor 38 within the memory cell 17 and is connected to bit line BL1. A gate of transistor 38 is connected to the word line signal WL2. A source of transistor 38 is connected to a drain of a transistor 40. A gate of transistor 40 is connected to the program signal PGL 2/3. A source of transistor 40 is connected to a source of a transistor 42. A gate of transistor 42 is connected to the word line WL3. A drain of transistor 42 is connected to the bit line BL1 and other circuitry (not shown) as indicated by the dashed lines below memory cell 17.

In operation, each of memory cells 14, 15, 16 and 17 functions as an antifuse or a OTP memory having two storage bits per memory cell. Each memory cell contains three transistors. In order to program a first bit of memory cell 14 of the memory 10, the bit line BL0, the word line WL0 and the program line PGL 0/1 are all asserted. It should be well understood that the logic state of an asserted signal depends upon the conductivity type of the transistors and may therefore be either a logic high or logic low signal. The BL0 signal and the WL0 signal, in one form, are brought to a same voltage or different voltages, each of which is positive with respect to the voltage of the substrate (not shown in FIG. 1). In one form the substrate voltage is an electrical ground. The PGL 0/1 signal is brought to a voltage that is negative with respect to the substrate voltage. The value of the negative programming voltage that the PGL signals assume depends from application to application largely on gate dielectric thicknesses that are implemented. For example, programming voltages in a range of −0.7 volt to minus five volts may be used. For example, silicon dioxide can be used as a dielectric material with a thickness ranging from 1.3 nm to 5 nm. It should be understood that other negative voltages in combination with other dielectric thicknesses or materials may be used depending upon processing parameters that are selected. Other dielectric materials that are suitable include silicon nitride, silicon oxynitride or metal oxide layers sometimes referred to as high-k dielectrics. As a result of the voltage, a current path for a current 44 is created from the bit line BL0 through the first select transistor 20 and to program transistor 22. At program transistor 22 the current 44 flows through the gate dielectric thereof and causes dielectric breakdown at the drain/gate overlap region of program transistor 22. This overlap region will be further described below in connection with FIG. 2. As a result, the current 44 continues flowing from the gate of program transistor 22 to an input of the current limiting circuitry 12. The current limiting circuitry 12 has active devices that limit the magnitude of the breakdown current. As the impedance of the dielectric decreases, the current increases. However, the current limiting circuitry 12 prevents an uncontrolled increase in the dielectric current by decreasing the program voltage that is applied to the program line. This has the benefit of preventing a hard breakdown of the dielectric which may result in a runaway effect causing the junction between the source/drain and the substrate to breakdown. At the end of programming, a significantly lower impedance exists across the dielectric that permits at least three to four orders of higher magnitude of read current to flow through a programmed bit as opposed to an unprogrammed bit.

To read the first bit of memory cell 14 that was programmed above, the word line WL0 and the bit line BL0 are asserted. The program line PGL 0/1 is asserted by applying a predetermined fixed voltage which is either zero or has a negative potential with respect to the substrate. By way of example only, a fixed negative voltage to apply to the PGL program lines may be from zero to minus (0.7) volt depending upon process parameters that are implemented. The BL0 signal and the WL0 signal, in one form, are brought to a same voltage or different voltages, each of which is positive with respect to the voltage of the substrate (not shown in FIG. 1). For reading the bit line signal BL0 should be smaller in magnitude than it was during the program operation. If PGL 0/1 is asserted, it must also be substantially lower in magnitude than it was during the program operation. The signal WL0 may or may not be smaller in magnitude during the read operation than it was during the program operation. During the read operation, the substrate voltage remains at electrical ground. With the PGL 0/1 signal asserted, the PGL 0/1 signal is brought to a voltage that is negative with respect to the substrate voltage. If the bit being read was previously programmed, the current 44 exists from the bit line BL0 through the first select transistor 20 and to program transistor 22 which results in a read current flowing through first select transistor 20 and program transistor 22 from the bit line BL0 to the program line PGL 0/1. If the bit being read was not previously programmed, the current 44 does not exist and no read current flows. In one form, the sensing of whether or not this read current is flowing is sensed by circuitry (not shown) connected to the bit line BL0. The signals WL0 and BL0 must be smaller during a read operation than during a programming operation in order to prevent an accidental programming during a read.

Figure 2:
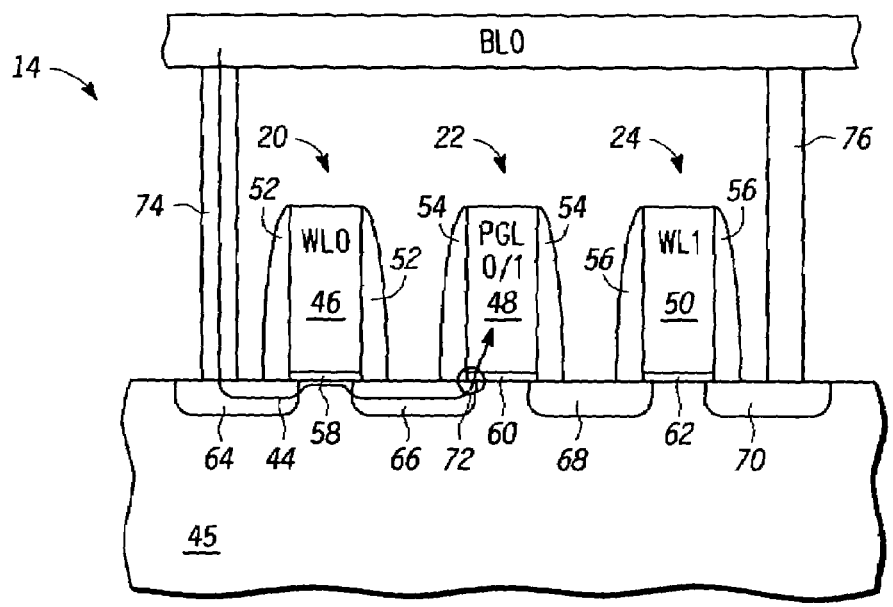
FIG. 2 illustrates in cross-sectional form an exemplary memory cell of the OTP memory array of FIG. 2.

Illustrated in FIG. 2 is a cross-sectional view of memory cell 14 of FIG. 1 that further illustrates the structural implementation of the three transistors required to store two bits. In the illustrated form a semiconductor substrate 45 is provided. Formed overlying and within the semiconductor substrate 45 are three transistors, first select transistor 20, program transistor 22 and second select transistor 24. First select transistor 20 has a gate 46 for receiving the word line signal WL0. First select transistor 20 has sidewall spacers 52 adjoining the gate 46 which overlies a gate oxide 58. First select transistor 20 also has a drain 64 and a source 66. Program transistor 22 has a gate 48 for receiving the program signal PGL 0/1. A sidewall spacer 54 adjoins gate 48. Underlying the gate 48 is a gate dielectric 60 that functions as an insulator. In one form the gate dielectric 60 is an oxide. Program transistor 22 shares the diffusion region forming source 66 with first select transistor 20. Program transistor 22 also has a diffusion region 68 which forms a drain. The second select transistor 24 has a gate 50 for receiving the word line signal WL1. A sidewall spacer 56 adjoins gate 50. Underlying gate 50 is a gate oxide 62. The second select transistor 24 has a source formed by the diffusion region 68 which also functions as the drain of program transistor 22. The second select transistor 24 also has a drain 70 formed by a diffusion region within the semiconductor substrate 45. A contact 74 is connected to drain 64 and to the bit line BL0. A contact 76 is connected to the drain 70 and to the bit line BL0. It should be understood that the regions between the illustrated sidewall spacers, bit line BL0 and contacts 74 and 76 are electrically isolated by an insulating material such as an oxide.

In a program operation mode, a current 44 originates in the bit line, passes through the contact 74 and passes through the channel region of first select transistor 20. The current 44 is passed through the source 66 and the gate dielectric 60, and is sunk by the gate 48 of program transistor 22. Note that when the current 44 passes through the channel region of first select transistor 20, the current is very close to the gate oxide 58 and is not necessarily drawn to scale. The current 44 passes through the gate dielectric of program transistor 22 in a region where the gate 48 and source 66 overlap in a region 72 illustrated in FIG. 2. The current 44 passes through an electron tunneling mechanism such as the known Fowler-Nordheim tunneling mechanism or a direct tunneling mechanism and is confined to the region 72. A negative voltage bias on the program line PGL 0/1 assists with the sinking of current 44. The negative voltage of the PGL 0/1 signal at gate 48 tends to make the electric field orientation at the overlapped region assume more of a vertical characteristic as contrasted with a grounded voltage on the gate 48. However, the negative voltage must not be so negative as to cause a global breakdown of the gate dielectric 60 outside of region 72. In other words, the gate bias voltage must be small enough in absolute value to avoid a global breakdown of the gate dielectric 60 and inadvertently program the other bit on the right hand side of the program transistor 22. As a result, the gate dielectric breaks down into two physically distinct regions. A first distinct region, region 72, is in the overlapped region of the diffusion of source 66 and gate 48. A second distinct region is in the overlapped region of diffusion region 68 and gate 48 on an opposite edge of gate 48 than region 72. These two physically distinct regions permit the separate and individual programming of two bits associated with the program transistor 22.

In a read mode operation, the current 44 will not be present if the bit has not been previously programmed. Assume that the bit associated with the left side of program transistor 22 was previously programmed. Therefore, during a read operation, the current 44 will again be present. The current that is sunk by the gate 48 of program transistor 22 is conducted along the program line PGL 0/1 of FIG. 1 and is sensed by conventional circuitry (not shown). The sensing circuitry will detect whether or not the bit on the left hand side of the gate of program transistor 22 has a relatively high impedance state or a lower impedance state.

Figure 3:
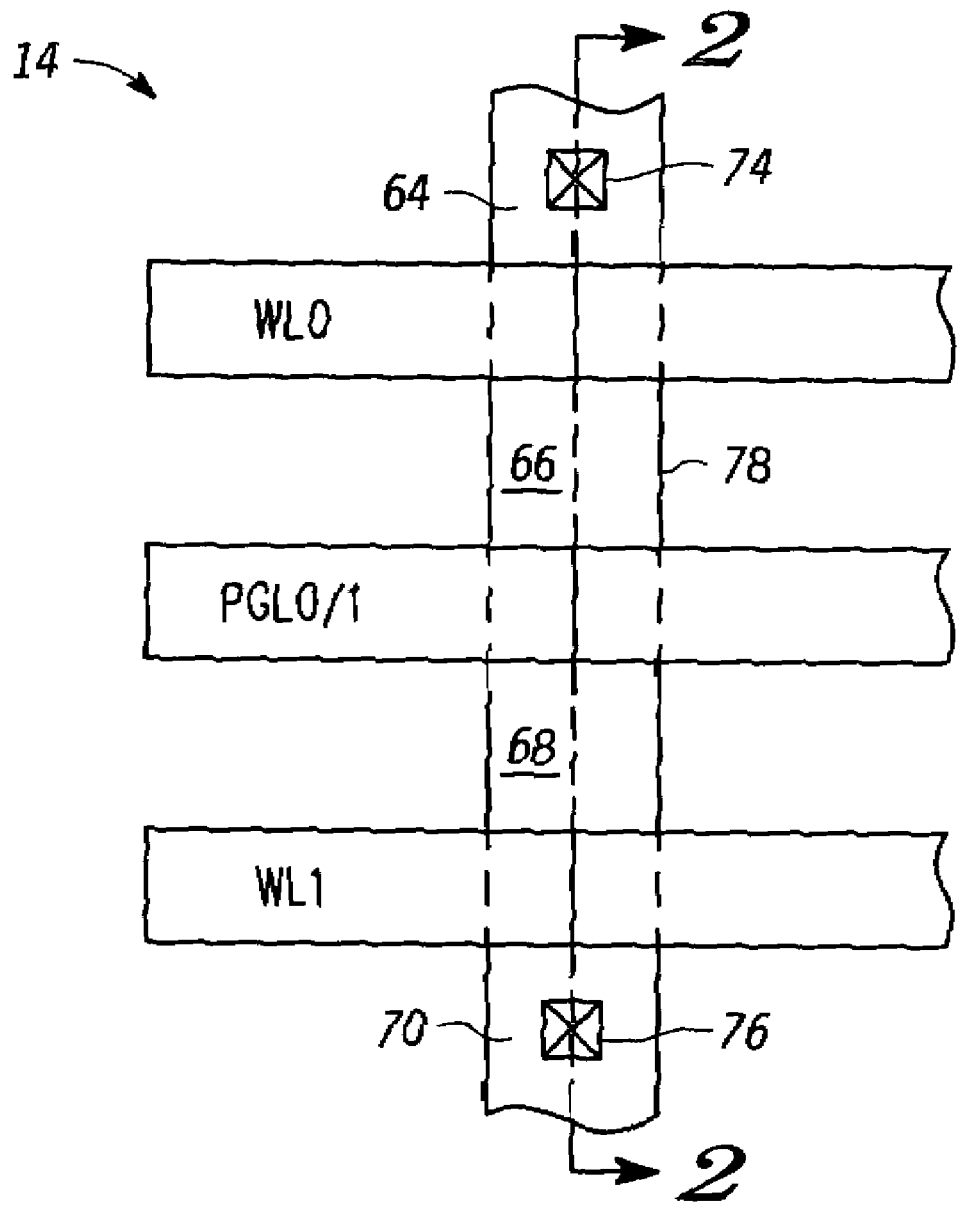
FIG. 3 illustrates in layout form the exemplary memory cell of FIG. 2.

Illustrated in FIG. 3 is a top plan view of the memory cell 14. The word line WL0, the program signal PGL 0/1 and the word line WL0 are implemented by parallel placed conductors. It should be understood that any conductive material may be used to implement these conductors, such as a metal or polysilicon. The word lines WL0 and WL1 and the program signal PGL 0/1 overlie the active region 78 within the semiconductor substrate 45 and represent the diffusion regions within the semiconductor substrate 45. Contact 74 connects to the drain 64. Between the word line WL0 and the program signal PGL 0/1 conductor is the source 66. Between the program signal PGL 0/1 and the word line WL1 is diffusion region 68 that functions as a drain for program transistor 22 and a source for the second select transistor 24. Contact 76 connects to the drain 70.

It should be noted that the layout of memory cell 14 is concise and compact. Three parallel conductors are utilized and may be formed having a width no larger than a minimum design dimension for a given set of design rules. No insulating isolation structures are required to be implemented between any of these parallel conductors or within the illustrated portion of the active region 78. Contact to the memory structure may be easily made to the memory cell 14. It should be noted that there are no major alignment issues associated with the layout of memory cell 14. In contrast, when structures such as capacitors are required to be implemented in the active region 78, a physical discontinuity in the active area can be present resulting in two segments which must overlie a conductor such as a word line. In such an embodiment the width of the underlying conductor had to be made larger to compensate for potential misalignment. In addition to the capacitance varying, a larger cell size was required to account for some anticipated misalignment. With the disclosed embodiments alignment issues associated with the use of capacitor structures to implement OTPs are avoided.

By now it should be appreciated that there has been provided a memory structure having OTP cells with two storage bits and a method for forming a semiconductor OTP memory. The disclosed OTP memory cell approximates the size of a one transistor cell size of conventional read only memories (ROMs) and nonvolatile memory (NVM). Circuit area required per bit is significantly reduced since the layout of FIG. 3 reduces the pitch per cell in the illustrated vertical direction. The disclosed storage cell may be used as a ROM replacement or an NVM replacement. It should be noted that the disclosed circuitry may be implemented with conventional transistors such as CMOS transistors. Because programming is implemented by current/voltage programming, various semiconductor packages may be used and no restriction on type or price of packaging exists. There is herein disclosed a three-transistor memory cell where three transistors are connected in series between two contacts of a bitline. In another form two bitlines per column of memory cells may be implemented, but this embodiment requires more layout area. A centered transistor acts as a one-time programmable memory cell or antifuse and is programmed by selective, dielectric breakdown of the gate oxide in the gate/drain and gate/source overlap regions. The other two transistors of the three transistors function as select transistors.

In the foregoing specification, the invention has been described with reference to specific embodiments. However, one of ordinary skill in the art appreciates that various modifications and changes can be made without departing from the scope of the present invention as set forth in the claims below. For example, any type of transistor semiconductor process may be used to implement the disclosed transistors (i.e. MOS, BiCMOS). The circuitry described herein may be used in numerous embedded memory applications. Further, the disclosed voltages and conductivities may be reversed from that illustrated. Also, the entire memory, sections of the memory or individual bit cells or transistors may be placed in individual, electrically isolated well diffusion regions. The storage circuitry described herein may be implemented as a standalone memory product or embedded with other circuitry. In one form, all the transistors in the array are implemented as N-channel transistors. In another form, all of the program transistors are N-channel and all of the select transistors are P-channel. In other forms all the transistors in the array are implemented as P-channel transistors. In yet another form, all of the program transistors are P-channel and all of the select transistors are N-channel.

There is herein been provided a one time programmable (OTP) memory having a two-bit memory cell. The two-bit memory cell has a first select transistor having a first current electrode coupled to a bit line, a control electrode coupled to a first word line, and a second current electrode. A programmable transistor has a first current electrode coupled to the second current electrode of the first select transistor, a control electrode coupled to a programming line, and a second current electrode. A second select transistor has a first current electrode coupled to the bit line, a control electrode coupled to a second word line, and a second current electrode coupled to the second current electrode of the programmable transistor. The programmable transistor has a first programmable region between the first current electrode and the control electrode and a second programmable region between the second current electrode and the control electrode. The first and second programmable regions can independently be converted from an initial impedance to a relatively lower impedance. In one form the control electrode of the programmable transistor is a gate and the programmable transistor has a gate dielectric under the gate. A portion of the first current electrode overlaps a first portion of the gate dielectric and a portion of the second current electrode overlaps a second portion of the gate dielectric. The first portion of the gate dielectric is the first programmable region, and the second portion of the gate dielectric is the second programmable region. In another form the first and second programmable regions are converted from the initial impedance to the relatively lower impedance responsive to application of a negative voltage applied to the control electrode of the programmable transistor. In yet another form the first programmable region is converted from the initial impedance to the relatively lower impedance by flowing current through the first and second current electrodes of the first select transistor, the first current electrode of the programmable transistor, and the control electrode of the programmable transistor. In yet another form the second programmable region is converted from the initial impedance to the relatively lower impedance by flowing current through the first and second current electrodes of the second select transistor, the second current electrode of the programmable transistor, and the control electrode of the programmable transistor. In yet another form the OTP memory further has word line select circuitry having a first output coupled to the control electrode of the first select transistor, a second output coupled to the control electrode of the second select transistor, and a third output. Current limiting circuitry has an input coupled to the third output of the word line select circuitry and an output coupled to the control electrode of the programmable transistor. In another form the OTP memory further includes a plurality of two-bit memory cells coupled to the bit line. In yet another form a plurality of two-bit memory cells is coupled to the first and second word lines and the programming line. In yet another form the OTP memory includes a semiconductor substrate, wherein the second current electrode of the first select transistor and the first current electrode of the programmable transistor share a doped region in the substrate. In another form the initial impedance is more than three orders of magnitude greater than the relatively lower impedance.

There is also provided a method of programming a two-bit memory cell. A first select transistor is provided having a first current electrode coupled to a bit line, a control electrode coupled to a first word line, and a second current electrode. A programmable transistor is provided having a first current electrode coupled to the second current electrode of the first select transistor, a control electrode coupled to a programming line, and a second current electrode. A second select transistor is provided having a first current electrode coupled to the bit line, a control electrode coupled to a second word line, and a second current electrode coupled to the second current electrode of the programmable transistor. To program a first bit, a first programming current is applied through the first and second current electrodes of the first select transistor, the first current electrode of the programmable transistor, and the control electrode of the programmable transistor. To program a second bit, a second programming current is applied through the first and second current electrodes of the second select transistor, the second current electrode of the programmable transistor, and the control electrode of the programmable transistor. In yet another form to program the first bit further includes applying an enable signal to the first word line and a disable signal to the second word line. In another form the first bit is programmed by enabling the first select transistor, disabling the second select transistor, and applying a voltage differential between the first current electrode of the first select transistor and the control electrode of the programmable transistor. In another form the voltage differential causes the first programming current to flow from the first current electrode of the programmable transistor to the control electrode of the programmable transistor. In another form the voltage differential is a negative voltage applied at the control electrode of the programmable transistor and a positive voltage applied at the first current electrode of the first select transistor. In another form the first programming current is limited sufficiently to avoid damage to the first current electrode of the programmable transistor. In yet another form the first programming current is of sufficient magnitude and duration to cause a permanent reduction in an impedance between the first current electrode and the control electrode of the programmable transistor.

There is also provided a two-bit memory cell that has a programmable transistor in series between two select transistors, wherein the programmable transistor has a first programmable region between a gate and a first source/drain and a second programmable region between the gate and a second source/drain. In one form the first programmable region is a first portion of a gate dielectric of the programmable transistor, the second programmable region is a second portion of the gate dielectric, and the first and second portions of the gate dielectric are permanently programmable to a condition of reduced impedance. In another form the first and second portions of the gate dielectric are converted to the condition of reduced impedance by current flow therethrough.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A one time programmable (OTP) memory having a two-bit memory cell, wherein the two-bit memory cell comprises:

a first select transistor having a first current electrode coupled to a bit line, a control electrode coupled to a first word line, and a second current electrode;

a programmable transistor having a first current electrode coupled to the second current electrode of the first select transistor, a control electrode dielectric, a control electrode coupled to a programming line, and a second current electrode; and a second select transistor having a first current electrode, a control electrode coupled to a second word line, and a second current electrode coupled to the second current electrode of the programmable transistor, wherein the programmable transistor has a first programmable region between the first current electrode thereof and the control electrode thereof and a second programmable region between the second current electrode thereof and the control electrode thereof, wherein in response to the first select transistor being conductive, current is passed through the first current electrode of the programmable transistor and the control electrode dielectric to the control electrode thereof in a region where the control electrode and the first current electrode overlap, and in response to the second select transistor being conductive, current is passed through the second current electrode of the programmable transistor and the control electrode dielectric to the control electrode thereof in a region where the control electrode and the second current electrode overlap, wherein current flows from the current electrode of the programmable transistor during a program operation.

2. The OTP memory of claim 1 wherein the the first current electrode of the second select transistor is coupled to the bit line wherein both the first current electrode of the first select transistor and the first current electrode of the second select transistor are coupled to the same bit line.

3. The OTP memory of claim 1 wherein the first and second programmable regions are converted from an initial impedance to a relatively lower impedance responsive to application of a negative voltage applied to the control electrode of the programmable transistor.

4. The OTP memory of claim 1 wherein the first programmable region is converted from an initial impedance to a relatively lower impedance by flowing current through the first and second current electrodes of the first select transistor, the first current electrode of the programmable transistor, and the control electrode of the programmable transistor.

5. The OTP memory of claim 1 wherein the second programmable region is converted from an initial impedance to a relatively lower impedance by flowing current through the first and second current electrodes of the second select transistor, the second current electrode of the programmable transistor, and the control electrode of the programmable transistor.

6. The OTP memory of claim 1 further comprising:
   word line select circuitry having a first output coupled to the control electrode of the first select transistor, a second output coupled to the control electrode of the second select transistor, and a third output; and
   current limiting circuitry having an input coupled to the third output of the word line select circuitry and an output coupled to the control electrode of the programmable transistor.

7. The OTP memory of claim 1 further comprising a plurality of two-bit memory cells coupled to the bit line.

8. The OTP memory of claim 1 further comprising a plurality of two-bit memory cells coupled to the first and second word lines and the programming line.

9. The OTP memory of claim 1 further comprising a semiconductor substrate, wherein the second current electrode of the first select transistor and the first current electrode of the programmable transistor share a doped region in the semiconductor substrate.

10. The OTP memory of claim 1, wherein the first programmable region and the second programmable region can independently be converted from an initial impedance to a lower impedance wherein the initial impedance is more than three orders of magnitude greater than the relatively lower impedance.

11. A method of operating a one time programmable (OTP) memory, comprising:
   providing a first select transistor having a first current electrode coupled to a bit line, a control electrode coupled to a first word line, and a second current electrode;
   providing a programmable transistor having a first current electrode coupled to the second current electrode of the first select transistor, a control electrode coupled to a programming line, and a second current electrode;
   providing a second select transistor having a first current electrode coupled to the same bit line, a control electrode coupled to a second word line, and a second current electrode coupled to the second current electrode of the programmable transistor, the first select transistor, the programmable transistor and the second select transistor forming a two-bit memory cell;
   programming a first bit by applying a first programming current through the first and second current electrodes of the first select transistor, the first current electrode of the programmable transistor, and the control electrode of the programmable transistor; and
   programming a second bit by applying a second programming current through the first and second current electrodes of the second select transistor, the second current electrode of the programmable transistor, and the control electrode of the programmable transistor.

12. The method of claim 11, wherein to program the first bit further comprises applying an enable signal to the first word line and a disable signal to the second word line.

13. The method of claim 11, wherein to program the first bit further comprises enabling the first select transistor, disabling the second select transistor, and applying a voltage differential between the first current electrode of the first select transistor and the control electrode of the programmable transistor.

14. The method of claim 13, wherein the voltage differential causes the first programming current to flow from the first current electrode of the programmable transistor to the control electrode of the programmable transistor.

15. The method of claim 14, wherein the voltage differential comprises a negative voltage applied at the control electrode of the programmable transistor and a positive voltage applied at the first current electrode of the first select transistor.

16. The method of claim 15, further comprising:
   limiting the first programming current sufficiently to avoid damage to the first current electrode of the programmable transistor.

17. The method of claim 11, wherein the first programming current is of sufficient magnitude and duration to cause a permanent reduction in an impedance between the first current electrode and the control electrode of the programmable transistor.

18. A one time programmable (OTP) memory cell comprising a programmable transistor in series with two select transistors between two contacts of a single bit line, wherein the programmable transistor comprises a first programmable region between a gate thereof and a first source/drain thereof and a second programmable region between the gate and a second source/drain thereof.

19. The one time programmable (OTP) memory cell of claim 18, wherein the first programmable region is a first portion of a gate dielectric of the programmable transistor, the second programmable region is a second portion of the gate dielectric, and the first and second portions of the gate dielectric are permanently programmable to a condition of reduced impedance.

20. The one time programmable (OTP) memory cell of claim 19, wherein the first and second portions of the gate dielectric are converted to the condition of reduced impedance by current flow therethrough.

* * * * *